(12) United States Patent
Horvath

(10) Patent No.: US 8,130,228 B2
(45) Date of Patent: Mar. 6, 2012

(54) SYSTEM AND METHOD FOR PROCESSING LOW DENSITY PARITY CHECK CODES USING A DETERMINISTIC CACHING APPARATUS

(75) Inventor: Thomas A. Horvath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 901 days.

(21) Appl. No.: 12/139,224

(22) Filed: Jun. 13, 2008

(65) Prior Publication Data

US 2009/0313459 A1 Dec. 17, 2009

(51) Int. Cl.
- G06F 15/80 (2006.01)
- G06F 13/14 (2006.01)
- G06F 11/00 (2006.01)
- G09G 5/36 (2006.01)
- G11C 29/00 (2006.01)

(52) U.S. Cl. ........ 345/505; 345/520; 345/557; 714/804; 714/805

(58) Field of Classification Search .......... 345/536–538, 345/557, 505, 520

See application file for complete search history.

(56) References Cited

U.S. PATENT DOCUMENTS

| | | | |
|---|---|---|---|
| 4,334,309 A | | 6/1982 | Bannon et al. |
| 2004/0034828 A1* | | 2/2004 | Hocevar ................ 714/800 |
| 2007/0011568 A1 | | 1/2007 | Hocevar |
| 2007/0013561 A1* | | 1/2007 | Xu et al. ................ 341/50 |
| 2007/0226578 A1 | | 9/2007 | Eroz et al. |
| 2007/0283218 A1 | | 12/2007 | Gopalakrishnan et al. |
| 2008/0028272 A1 | | 1/2008 | Richardson |
| 2008/0046801 A1 | | 2/2008 | Sugitani et al. |
| 2008/0052595 A1 | | 2/2008 | Haratsch et al. |
| 2008/0082895 A1 | | 4/2008 | Eroz et al. |

FOREIGN PATENT DOCUMENTS

| | | |
|---|---|---|
| EP | 1 648 090 A2 | 4/2006 |
| JP | 2003050741 A | 2/2003 |
| WO | WO 2006020460 A2 | 2/2006 |

* cited by examiner

*Primary Examiner* — Hau Nguyen

(74) *Attorney, Agent, or Firm* — Scully, Scott, Murphy & Presser, P.C.; Brian Verminski, Esq.

(57) ABSTRACT

A system, method and article of manufacture are disclosed for processing Low Density Parity Check (LDPC) codes. The system comprises a multitude of processing units for processing the codes; and a processor chip including an on-chip, multi-port data cache for temporarily storing the LDPC codes. This data cache includes a plurality of input ports for receiving the LDPC codes from some of the processing units, and a plurality of output ports for sending the LDPC codes to others of the processing units. An off-chip, external memory stores the LDPC codes and transmits the LDPC codes to and receives the LDPC codes from at least some of the processing units. A sequence processor controls the transmission of the LDPC codes between the processor units and the on-chip data cache so that the LDPC codes are processed by the processing units according to a given sequence.

25 Claims, 4 Drawing Sheets

LDPC PROCESSING DATA FLOW BLOCK DIAGRAM

AN EXEMPLARY LDPC CODE FOR COMPRESSION WITH DECODER ONLY SIDE INFORMATION

LDPC PROCESSING DATA FLOW BLOCK DIAGRAM

SYSTEM AND METHOD FOR PROCESSING LOW DENSITY PARITY CHECK CODES USING A DETERMINISTIC CACHING APPARATUS

BACKGROUND OF THE INVENTION

1. Field of the Invention

This invention generally relates to processing Low Density Parity check codes, and more specifically, to processing these codes using a deterministic data cache.

2. Background Art

Low Density Parity Check (LDCP) codes are used to compress, or encode, data. These codes are used in a number of technologies including mobile communications and video compression. In video compression, for example, LDPC codes are used in a Wyner-Ziv coding process. This process provides simple, low cost encoding with low computational complexity by shifting the computational load from the encoder to the decoder.

Briefly speaking, in Wyner-Ziv coding, the decoder has access to side information that is not available to the encoder, and such side information can still be exploited to achieve greater compression than would otherwise be possible. Therefore, with the objective to achieve very low encoding complexity, Wyner-Ziv video coding systems exploit the statistical correlation among neighboring video frames only at the decoder, and thus relieve the encoder of significant computational load.

In general, a Wyner-Ziv video compression system is comprised of a video encoder, which compresses (or encodes) a video signal into a compressed video frame, and a video decoder, which decompresses (or decodes) the compressed video frame to produce a reconstructed video frame. At any time instant, a video frame V is to be encoded by the encoder Since the decoder has access to the previously decoded frame $V_o$, it can generate prior knowledge about V from the previously decoded frame $V_o$, and use this knowledge in the decoding process. Being aware of the existence of the prior knowledge about $V_o$ at the decoder, the encoder can transmit fewer bits, and thus achieve greater compression, than would otherwise be possible.

The real time processing of the decoding algorithm, referred to as the Belief Propagation algorithm, for an LDPC decoder in a Wyner-Ziv based video decoder involves processing of up to 50 iterations per frame where each frame contains of tens to hundreds of thousand of LDPC probability vectors, each of which may be 16 to 32 elements of 2 to 4 bytes per element, at a rate of 30 frames per second. In order to be able to process this amount of information a hardware accelerator is currently required. One of the main obstacles in processing such large numbers of LDPC codes is the prohibitively huge memory bandwidth requirements. This problem is compounded by the fact that memory accesses are random, non-sequential, and consequently bursting memories such as DRAM are of little benefit. Even increasing the size of memory data widths has a limited effect because there is no advantage to making buses larger than the width of a single LDPC code. Consequently the best way to increase the necessary bandwidth is to use multi-ported high-speed memories. Multi-ported memories tend to be prohibitively expensive if implemented as standalone external memories and are consequently more efficient if implemented as memory objects internal to a chip. Internal memories also have the advantage of being able to be clocked at a higher rate than external memories. However, internal memories tend to be limited in size compared to external memories and therefore limit the overall number of LDPC codes that can be processed.

In order to get the optimum performance and allow for large number of LDPC codes, it is desirable to adapt standard processing techniques such as caching which allows for a more efficient memory subsystem implementation. However, the caching requirements for processing LDPC codes differs significantly from the requirements of standard CPU based systems. Standard processor caches are designed to rely on processing programs, which statistically operate within a limited region long enough for the caches to be of significant use. LDPC codes tend to be more efficient as they span large regions that are consequently not readily localized. This makes the standard statistically based caches inefficient for processing LDPC codes. There are other advantages to processing LDPC codes and these are: (1) the code maps are deterministic and do not have to be processed dynamically but can be characterized once and from there on used repeatedly; and (2) the order of the processing can be reordered to best take advantage of any localization to optimize cache utilization.

SUMMARY OF THE INVENTION

The present invention provides a system, method and article of manufacture for processing Low Density Parity Check (LDPC) codes. The system comprises a multitude of processing units for processing said codes; and a processor chip including an on-chip, multi-port data cache for temporarily storing the LDPC codes, the data cache including a plurality of input ports for receiving the LDPC codes from some of the processing units, and a plurality of output ports for sending the LDPC codes to others of the processing units. An off-chip, external memory is used for storing the LDPC codes, and for transmitting the LDPC codes to and receiving the LDPC codes from at least some of the processing units. A sequence processor is provided for controlling the transmission of the LDPC codes between the processing units and the on-chip data cache so that the LDPC codes are processed by the processing units according to a given sequence.

In a preferred embodiment, the system further comprises a control store for storing instructions to determine the flow of the LDPC codes between the on-chip data cache, the external memory, and the processing units. These instructions may include read and write addresses for both the on-chip data cache and the external memory, and commands designating synchronization and path control needed for processing the LDPC codes. In addition, preferably, the sequence processor receives said defined sequence from the control store. Also, in the preferred embodiment, the processing units and the sequence processor are located on the processing chip, and the control store is, like the external memory, located off the processing chip.

The preferred embodiment of the invention, described below in detail, uses a deterministic multi-ported hardware data cache with a preprogrammed sequence processor to generate control path and addressing for both internal cache and external memory. The external control memory used by the sequence processor contains the control code for many (hundreds) of LDPC code maps where any map (control sequence) can be dynamically selected for processing any given frame of a video sequence. The initial data to be processed is downloaded to the external data memory and the sequence processor then processes the necessary number of iterations through the system using both the internal and external memories as predetermined by the previously generated control sequence.

The processing of the data within the system may include both parallel and pipelined dedicated processing units. The resulting data is placed in the external memory, from which the host system processor can upload and analyze the data.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

The present invention generally relates to Low Density Parity Check (LDPC) codes, which are used to compress, or encode, data, and these codes are used in a number of fields including mobile communications and video compression. In video compression, LDPC codes are used in a Wyner-Ziv coding process, which may be used to provide simple, low cost encoding with low computational complexity by shifting the computational load from the encoder to the decoder. As is known in the art, an LDPC code can be represented by a bipartite graph, as for example as illustrated in FIG. 1.

Figure 1:
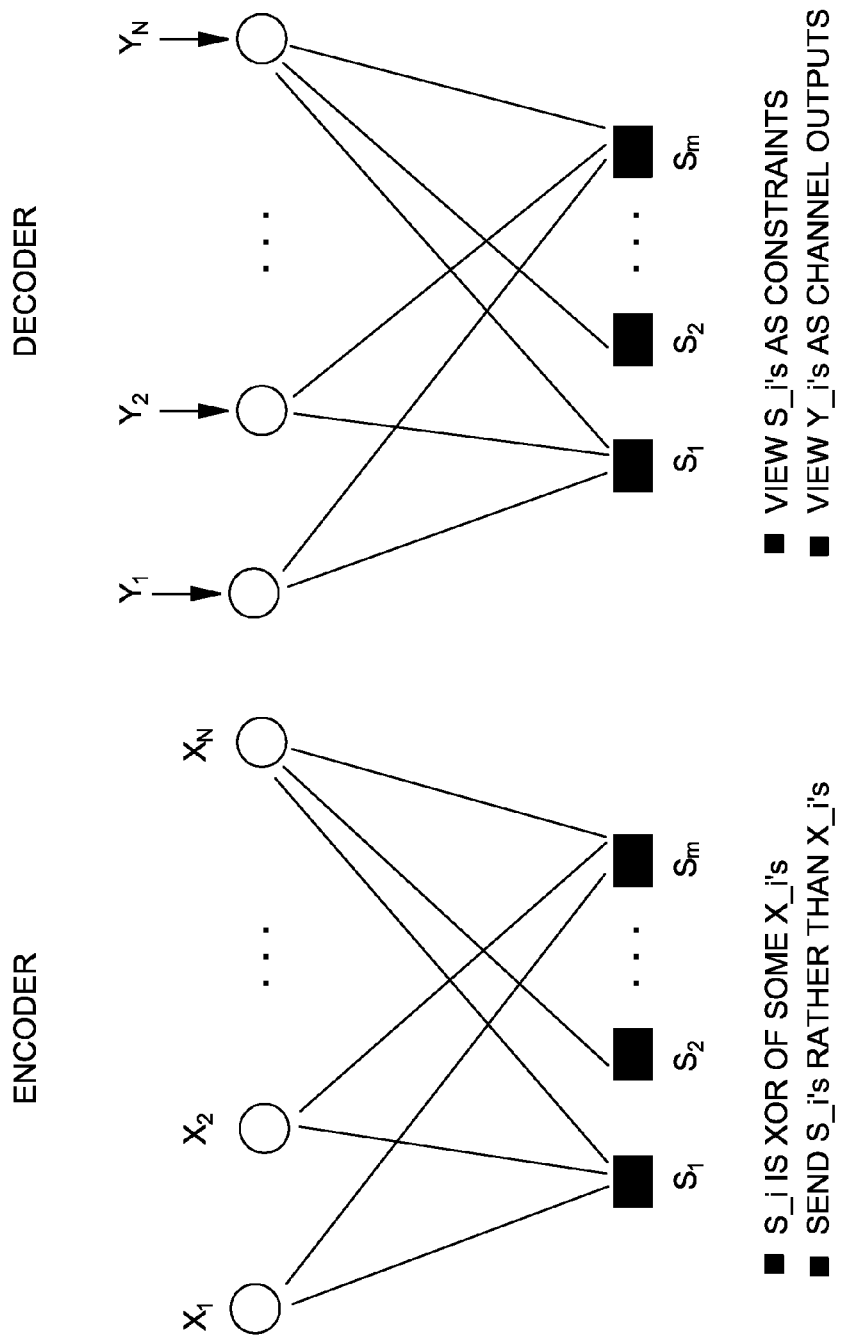
FIG. 1 illustrates an LDPC code for compression with decoder only side information.

To see how an LDPC code can be applied to compress a sequence, consider the sequence $X_1X_2 \ldots X_N$, shown in FIG. 1. Without loss of generality, this sequence can be considered as a binary sequence. On the encoder side, since an LDPC code can be conveniently represented by a bi-partite graph, we can regard $X_1X_2 \ldots X_N$ as the input to the variable nodes (circle-shaped) of the bi-partite graph in FIG. 1. The output $S_1S_2 \ldots S_m$ of the LDPC code is taken from the check nodes (square-shaped) of the bipartite graph in FIG. 1 in response to the input $X_1X_2 \ldots X_N$, where each $S_j$ is a linear combination of the subset of $X_1X_2 \ldots X_N$. For example, if $S_1$ is connected to $X_1$, $X_3$, and $X_5$, then $S_1 = X_1/X_2/X_5$, where / denotes addition in the binary field GF(2). In the literature, the sequence $S_1S_2 \ldots S_m$ is referred to as the syndrome of $X_1X_2 \ldots X_N$. Since $S_1S_2, \ldots S_m$ is typically a much shorter binary sequence than $X_1X_2 \ldots X_N$, compression is achieved, and the compression rate is equal to m/N.

On the decoder side, the decoder uses the same bi-partite graph to decode $X_1X_2 \ldots X_N$ from the side information $Y_1Y_2 \ldots Y_N$ and the received sequence $S_1S_2 \ldots S_m$. Note that in the case where the side information $Y_1Y_2 \ldots Y_N$ is not available, we can regard $Y_1Y_2 \ldots Y_N$ as erasures at the decoder input. There are many algorithms that can be used in the decoding process. One of the practically important low complexity-decoding algorithms is Belief Propagation (BP) based iterative "message passing" decoding algorithm.

In the source coding with decoder side information setup, a typical decoder using BP decoding works as follows. From $Y_1Y_2 \ldots Y_N$ and the statistical correlation between $Y_1Y_2 \ldots Y_N$ and $X_1X_2 \ldots X_N$, the decoder gets the initial soft information about $X_1X_2 \ldots X_N$, that is, the likelihood that each $X_i$ is equal to 0 or 1 in the binary case. This initial soft information is injected into the variable nodes of the bi-partite graph, and propagates along the edges in the bi-partite graph to the check nodes. At the check nodes, this information is updated according to the constraints set by the received syndrome values $S_1S_2 \ldots S_m$, and sent back to the variable nodes. Combining the information from the checknodes and the initial soft information, the variable nodes get a new iteration of the soft information about $X_1X_2 \ldots X_N$. From this new information, the decoder can form an estimate of $X_1X_2 \ldots X_N$.

The above process of exchanging information between variable nodes and check nodes continues until either one of the following conditions is satisfied: (1) the number of iterations exceeds a pre-set threshold; or (2) the decoder has obtained an estimated sequence whose output in the bi-partite graph is equal to $S_1S_2 \ldots S_m$. If condition (2) happens and the estimated sequence is equal to $X_1X_2 \ldots X_N$, the decoding is successful. If the event that the decoding is successful happens with probability close to 1, the compression efficiency of the LDPC code is determined by the gap between the rate m/N and the theoretical limit $H(X_1X_2 \ldots X_N|Y_1Y_2 \ldots Y_N)/N$.

Figure 2:
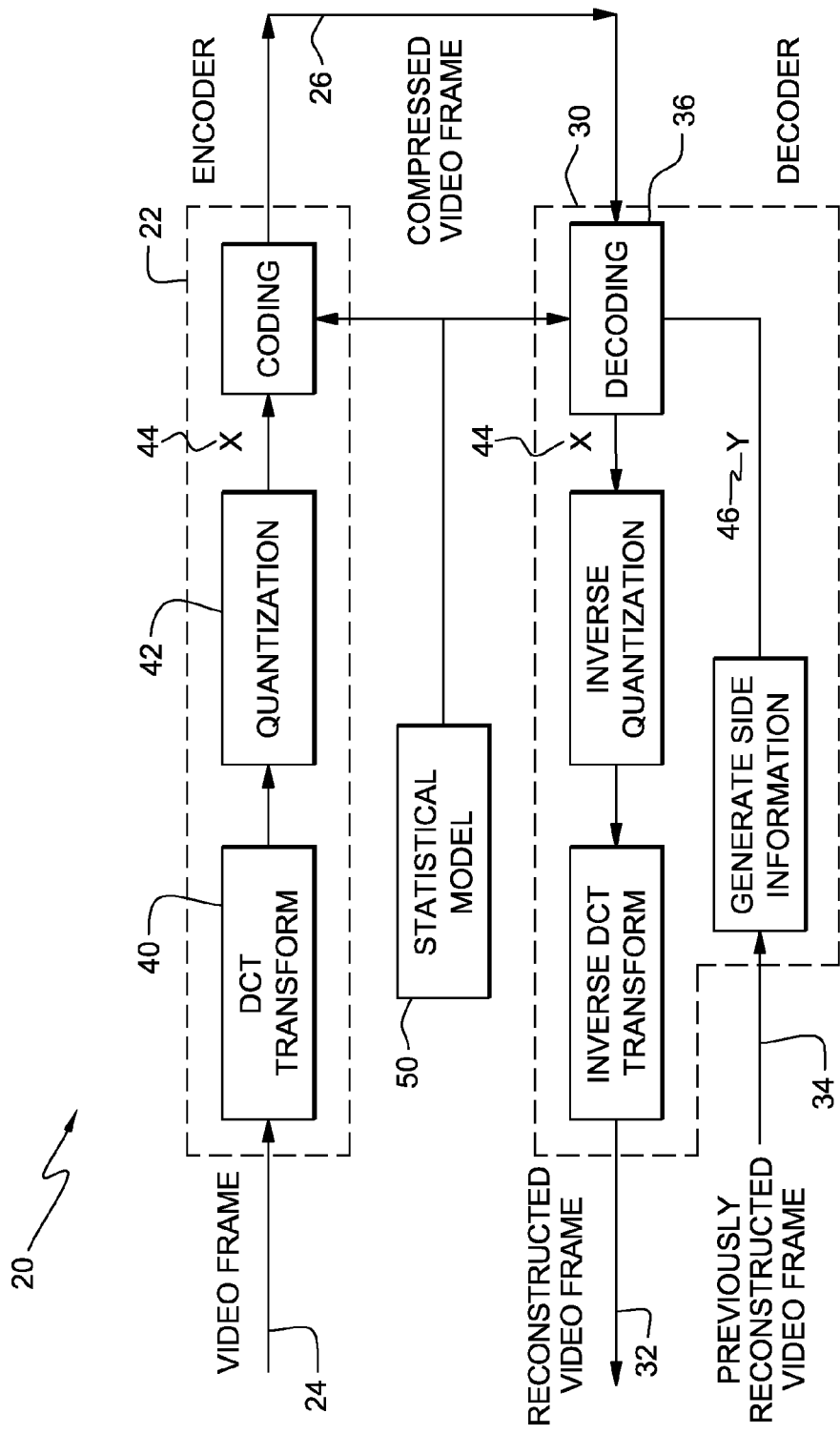
FIG. 2 shows a Wyner-Ziv video compression system with which the present invention may be used.

FIG. 2 illustrates a Wyner-Ziv video compression system 20. This system, in general, comprises a video encoder 22, which compresses (or encodes) a video signal 24 into a compressed video frame 26, and a video decoder 30, which decompresses (or decodes) the compressed video frame 455 to produce reconstructed video frame 32. At any time instant, a video frame V 24 is to be encoded by the encoder 22. Since the decoder 30 has access to the previously decoded frame 34, it can generate prior knowledge about V 24 from the previously decoded frame 34, and use this knowledge in the decoding process 36. Being aware of the existence of the prior knowledge about V 24 at the decoder 30, the encoder 22 can transmit fewer bits, and thus achieve greater compression, than would otherwise be possible.

In operation, the encoder first compresses V 24 by using a discrete cosine transform (DCT) 40, and quantization 42 (equivalent to the intra mode transform and quantization in MPEG coding). The resultant signal x 44 is called the quantized sequence, and takes value in a discrete set.

It may be noted that although the side information y 46 is not assumed on the encoder side, the encoder 22 needs to know the statistical relationship between x 44 and y 46 as reflected in the statistical model 50 in order to encode x 44. For the purpose of reducing encoding complexity, the statistical model should be estimated by using computationally efficient methods in Wyner-Ziv video compression systems. Also, as will be understood by those of ordinary skill in the art, in principal, the encoder 22 and the decoder 30 may be distant from one another.

This invention deals with a mechanism to provide the necessary amount of data to keep all of the processing units in the video compression system at their maximum utilization level when large numbers (on the order of tens to hundreds of thousands) of LDPC codes are used. In general this is done by using the combination of a hierarchical dedicated memory system coupled with an offline optimizer sequence compiler which in combination allow for the processing of large number of LDPC codes.

Figure 3:
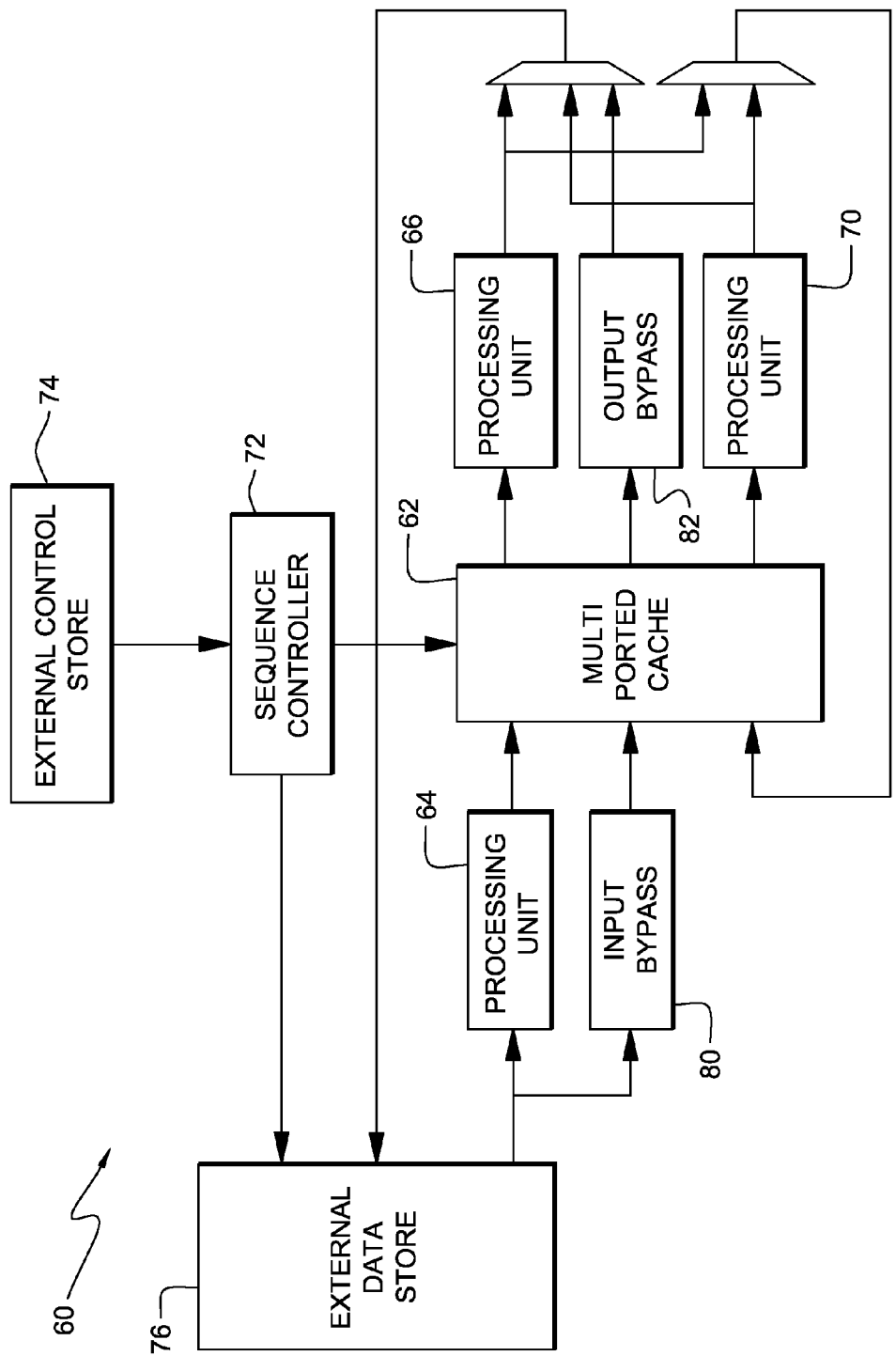
FIG. 3 is a block diagram showing an LDPC processing data flow in accordance with a preferred embodiment of this invention.

FIG. 3 is a block diagram of, for example, a preferred hardware implementation 60 of the present invention. This implementation is designed around a multi-ported high-speed internal data cache 62, which acts as a temporary storage unit during the processing of a sequence of LDPC codes. The internal cache 62 feeds and/or is being fed by multiple processing units, represented at 64, 66 and 70, in a timely manner under the control of a sequence processor 72, which executes its instructions from an external control storage unit 74. The instructions processed determine the flow of the data between an external memory 76, the internal memory 62 as well as the processing units 64, 66 and 70. The instructions contain read and write addresses for both memory units as well as simple commands designating synchronization and path control needed for processing. The instructions are pre-calculated based on a specific LDPC tree map.

The preferred pre-calculation process involves optimizing and scheduling the processing of the data in a manner that is most optimal for the hardware environment. This involves the rearranging of the processing sequence so that the internal cache 62 is optimally utilized such that once a data vector is stored in the cache it will remain until it is no longer needed, if possible. This involves analyzing various execution sequences and picking the most optimal one. If it is impossible to keep the data in the cache 62 for the duration, then the most optimal cache replacement strategy is preferably determined. Also, the hardware could provide bypass paths, represented at 80 and 82, in order to store cast out data and later re-fetch the data without having to recalculate its current value. If so, the scheduling software needs to take this into account and perform operations to save and restore data in a timely manner.

Included in the preferred design are several mechanisms for synchronizing the processing of data in a manner such that data is not fetched from external or internal memory locations before it is available and conversely it does not try to overwrite data in either storage units before the existing data properly expires. The combination of hardware sequencing and software scheduling provides a unique environment which is capable of processing a significantly larger number of LDPC codes at greater performances than are currently realized.

The preferred embodiment of the invention, as described above, provides a number of important advantages. For example, this embodiment of the invention provides a cached processing environment that is adapted to processing LDPC codes at a higher rate and lower cost using both external and internal memories than would be possible using only one or the other. Also, the invention, as described above, may be used to process Low Density Parity Check codes using a deterministic multi-ported hardware data cache with a pre-programmed sequence process to generate control path and addressing information for both internal cache and external memory. In addition, the preferred embodiment of the of the invention may be used to process a large number of Low Density Parity Code probability vectors in a cost effective hardware system.

Figure 4:
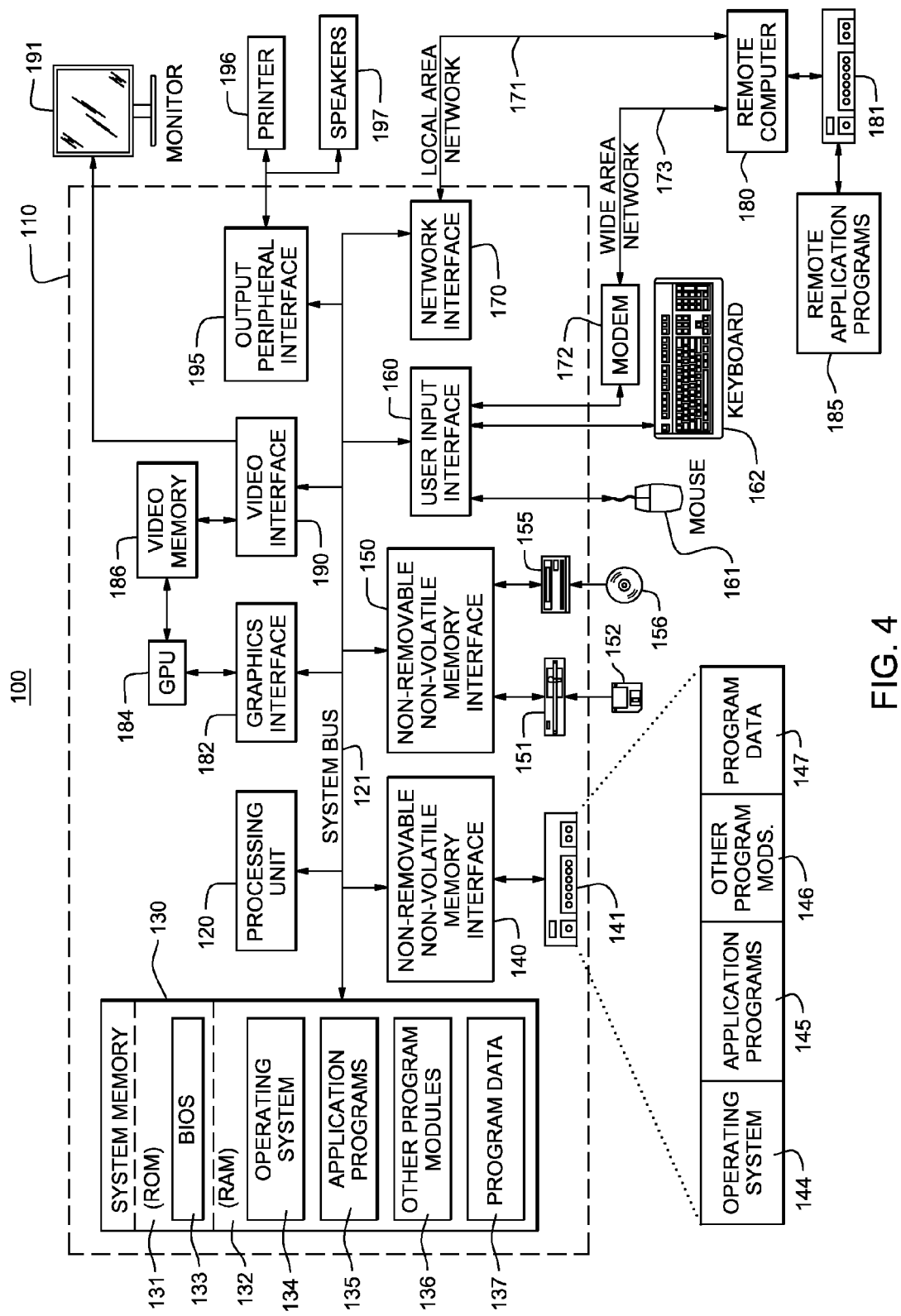
FIG. 4 illustrates an exemplary computing environment in which the invention may be implemented.

For example, FIG. 4 and the following discussion provide a brief general description of a suitable computing environment in which the invention may be implemented. It should be understood, however, that handheld, portable, and other computing devices of all kinds are contemplated for use in connection with the present invention. While a general-purpose computer is described below, this is but one example, the present invention may be implemented in an environment of networked hosted services in which very little or minimal client resources are implicated, e.g., a networked environment in which the client device serves merely as a browser or interface to the World Wide Web.

Although not required, the invention can be implemented via an application-programming interface (API), for use by a developer, and/or included within the network browsing software, which will be described in the general context of computer-executable instructions, such as program modules, being executed by one or more computers, such as client workstations, servers, or other devices. Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations.

Other well known computing systems, environments, and/or configurations that may be suitable for use with the invention include, but are not limited to, personal computers (PCs), server computers, hand-held or laptop devices, multi-processor systems, microprocessor-based systems, programmable consumer electronics, network PCs, minicomputers, mainframe computers, and the like. The invention may also be practiced in distributed computing environments where tasks are performed by remote processing devices that are linked through a communications network or other data transmission medium. In a distributed computing environment, program modules may be located in both local and remote computer storage media including memory storage devices.

FIG. 4, thus, illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

With reference to FIG. 4, an exemplary system for implementing the invention includes a general purpose-computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 110.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 4 illustrates operating system 134, application programs 135, other program modules 136, and program data 137.

The computer 110 may also include other removable/non-removable, volatile/nonvolatile computer storage media. By way of example only, FIG. 4 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 3 provide storage of computer readable instructions, data structures, program modules and other data for the computer 110. In FIG. 4, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies.

A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB).

A monitor 191 or other type of display device is also connected to the system bus 121 via an interface, such as a video interface 190. A graphics interface 182, such as Northbridge, may also be connected to the system bus 121. Northbridge is a chipset that communicates with the CPU, or host-processing unit 120, and assumes responsibility for accelerated graphics port (AGP) communications. One or more graphics processing units (GPUs) 684 may communicate with graphics interface 182. In this regard, GPUs 184 generally include on-chip memory storage, such as register storage and GPUs 184 communicate with a video memory 186. GPUs 184, however, are but one example of a coprocessor and thus a variety of co-processing devices may be included in computer 110. A monitor 191 or other type of display device is also connected to the system bus 121 via an interface, such as a video interface 190, which may in turn communicate with video memory 186. In addition to monitor 691, computers may also include other peripheral output devices such as speakers 197 and printer 196, which may be connected through an output peripheral interface 195.

The computer 10 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 3. The logical connections depicted in FIG. 4 include a local area network (LAN) 171 and a wide area network (WAN) 173, but may also include other networks Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 4 illustrates remote application programs 185 as residing on memory device 181. It will be appreciated that the network connections shown are exemplary and other means of establishing a communications link between the computers may be used.

One of ordinary skill in the art can appreciate that a computer 110 or other client device can be deployed as part of a computer network. In this regard, the present invention pertains to any computer system having any number of memory or storage units, and any number of applications and processes occurring across any number of storage units or volumes. The present invention may apply to an environment with server computers and client computers deployed in a network environment, having remote or local storage. The present invention may also apply to a standalone computing device, having programming language functionality, interpretation and execution capabilities.

As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the respective methods described herein. Alternatively, a specific use computer, containing specialized hardware for carrying out one or more of the functional tasks of the invention, could be utilized.

The present invention, or aspects of the invention, can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A system for processing multiple Low Density Parity Check (LDPC) codes to encode and decode data, the system comprising:
    a multitude of processing units for processing said multiple codes to encode and decode data, each of said codes being used by one of the processing units at a time to encode or decode data sequences having multiple data values;
    a processor chip including an on-chip, multi-port data cache for temporarily storing the LDPC codes, the data cache including:
    a plurality of input ports for receiving the LDPC codes from the processing units for storage in the data cache, and
    a plurality of output ports for sending the LDPC codes to the processing units for use by the processing units to encode and decode data sequences;
    an off-chip, external memory for storing the LDPC codes, and for transmitting the LDPC codes to and receiving the LDPC codes from the processing units; and
    a sequence processor for controlling the transmission of the LDPC codes between the processing units and the on-chip data cache so that the LDPC codes are processed by the processing units according to a given sequence to encode and decode the data sequences.

2. A system according to claim 1, further comprising a control store for storing instructions to determine the flow of the LDPC codes between the on-chip data cache, the external memory, and the processing units.

3. A system according to claim 2, wherein said instructions include read and write addresses for both the on-chip data cache and the external memory, and commands designating synchronization and path control needed for processing the LDPC codes.

4. A system according to claim 3, wherein the sequence processor receives said given sequence from the control store.

5. A system according to claim 2, wherein the processing units are located on the processor chip, the sequence processor is located on the processing chip, and the control store is located off the processor chip.

6. A system according to claim 1, further comprising an input by-pass unit connected to the external memory and to the on-chip data cache for transmitting the LDPC codes from the external memory to the on-chip data cache while bypassing the processing units.

7. A system according to claim 6, further comprising an output by-pass unit connected to the external memory and to the on-chip data cache for transmitting the LDPC codes from the on-chip data cache to the external memory while bypassing the processing units.

8. A system according to claim 1, wherein the processing units are located on the processor chip.

9. A system according to claim 8, wherein the sequence processor is located on the processor chip.

10. A system for processing Low Density Parity Check (LDPC) codes, comprising:
    a multitude of processing units for processing said codes;
    a processor chip including an on-chip, multi-port data cache for temporarily storing the LDPC codes, the data cache including:
    a plurality of input ports for receiving the LDPC codes from some of the processing units, and a plurality of output ports for sending the LDPC codes to others of the processing units;
    an off-chip, external memory for storing the LDPC codes, and for transmitting the LDPC codes to and receiving the LDPC codes from at least some of the processing units; and
    a sequence processor for controlling the transmission of the LDPC codes between the processing units and the on-chip data cache so that the LDPC codes are processed by the processing units according to a given sequence; and
    wherein individual ones of the LDPC codes are needed by different processing units at different times, and, once, one of the LDPC does is stored in the data cache, said one of the LDPC codes remains in the data cache until said one of the LDPC codes is no longer needed by any of the processing units.

11. A method for processing multiple Low Density Parity Check (LDPC) codes to encode and decode data, the method comprising the steps of:
    providing a multitude of processing units for processing said multiple codes to encode and decode data, each of said codes being used by one of the processing units at a time to encode or decode data sequences having multiple data values;
    providing a processor chip including an on-chip, multi-port data cache for temporarily storing the LDPC codes, the data cache including:
    a plurality of input ports for receiving the LDPC codes from the processing units for storage in the data cache, and
    a plurality of output ports for sending the LDPC codes to the processing units for use by the processing units to encode and decode data sequences;
    storing the LDPC codes in an off-chip external memory, and transmitting the LDPC codes between the external memory and the processing units; and
    controlling the transmission of the LDPC codes between the processing units and the on-chip data cache so that the LDPC codes are processed by the processor units according to a given sequence to encode and decode the data sequences.

12. A method according to claim 11, wherein the method further comprises the step of storing instructions, in a control store, to determine the flow of the LDPC codes between the on-chip data cache, the external memory, and the processing units.

13. A method according to claim 12, wherein said instructions include read and write addresses for both the on-chip data cache and the external memory, and commands designating synchronization and path control needed for processing the LDPC codes.

14. A method according to claim 13, wherein:
the controlling step includes the step of using a sequence processor for controlling said transmission of the LDPC codes; and
the method further comprises the step of the sequence processor receiving said given sequence from the control store.

15. A method according to claim 11, wherein individual ones of the LDPC codes are needed by different processing units at different times, and comprising the further step of once, one of the LDPC does is stored in the data cache, keeping said one of the LDPC codes in the data cache until said one of the LDPC codes is no longer needed by any of the processing units.

16. A method according to claim 13, wherein:
the controlling step includes the step of using a sequence processor for controlling said transmission of the LDPC codes; and
the method further comprises the step of the sequence processor receiving said defined sequence from the control store.

17. An article of manufacture comprising:
at least one computer usable device having computer readable program code logic tangibly embodied therein to execute a machine instruction in a sequence processor in a system for processing multiple Low Density Parity Check (LDPC) codes to encode and decode data, wherein said system comprises a multitude of processing units for processing said multiple codes to encode and decode data, each of said codes being used by one of the processing units at a time to encode or decode data sequences having multiple data values; a processor chip including an on-chip, multi-port data cache for temporarily storing the LDPC codes, the data cache including a plurality of input ports for receiving the LDPC codes from the processing units for storage in the data cache, and a plurality of output ports for sending the LDPC codes to the processing units for use by the processing units to encode and decode data sequences; and an off-chip external memory for storing the LDPC codes and transmitting the LDPC codes between the external memory and the processing units, said computer readable program code logic, when executing, performing the following step:
controlling the transmission of the LDPC codes between the processing units and the on-chip data cache so that the LDPC codes are processed by the processing units according to a given sequence to encode and decode the data sequences.

18. An article of manufacturer according to claim 17 wherein instructions are stored, in a control store, to determine the flow of the LDPC codes between the on-chip data cache, the external memory, and the processing units, and a sequence processor is used for controlling said transmission of the LDPC codes, and said computer readable program code logic, when executing, performs the further following step:
sending said given sequence from the control store to the sequence processor.

19. An article of manufacture according to claim 18, wherein said instructions include read and write addresses for both the on-chip data cache and the external memory, and commands designating synchronization and path control needed for processing the LDPC codes.

20. An article of manufacture according to claim 17, wherein individual ones of the LDPC codes are needed by different processing units at different times, and said computer readable program code logic, when executing, performs the following step of, once one of the LDPC does is stored in the data cache, keeping said one of the LDPC codes in the data cache until said one of the LDPC codes is no longer needed by any of the processing units.

21. A method of encoding video data, comprising the steps of:
passing a stream of video data through a multitude of processing units, each of the processing units using multiple Low Density Parity check (LDPC) codes in a Wyner-Ziv process to encode portions of said stream of video, each of said codes being used by one of the processing units at a time to encode or decode data sequences having multiple data values;
using an on-chip, multi-port data cache, located on a processor chip, for temporarily storing the LDPC codes, said data cache including:
a plurality of input ports for receiving the LDPC codes from the processing units for storage in the data cache, and
a plurality of output ports for sending the LDPC codes to the processing units for use by the processing units to encode and decode data sequences;
storing the LDPC codes in an off-chip external memory, and transmitting the LDPC codes between the external memory and the processing units; and
controlling the transmission of the LDPC codes between the processing units and the on-chip data cache so that the LDPC codes are processed by the processing units according to a given sequence to encode and decode the data sequences.

22. A method according to claim 21, wherein the method further comprises the step of storing instructions, in a control store, to determine the flow of the LDPC codes between the on-chip data cache, the external memory, and the processing units, said instructions including read and write addresses for both the on-chip data cache and the external memory, and commands designating synchronization and path control needed for processing the LDPC codes.

23. A system for encoding video data, comprising:
a multitude of processing units to encode and decode data;
an encoder for passing a stream of video data through the processor units, each of the processing units using multiple Low Density Parity check (LDPC) codes in a Wyner-Ziv process to encode portions of said stream of video data, each of said codes being used by one of the processing units at a time to encode or decode data sequences having multiple data values;
a processor chip including an on-chip, multi-port data cache for temporarily storing the LDPC codes, and including:
a plurality of input ports for receiving the LDPC codes from some of the processor units for storage in the data cache, and a plurality of output ports for sending the LDPC codes to others of the processor units for use by the processing units to encode and decode data sequences;

an off-chip external memory for storing the LDPC codes, and transmitting the LDPC codes between the external memory and at least some of the processing units; and a sequence processor for controlling the transmission of the LDPC codes between the processor units and the on-chip data cache so that the LDPC codes are processed by the processing units according to a given sequence to encode and decode the data sequences.

24. A system according to claim 23, further comprising a control store for storing instructions to determine the flow of the LDPC codes between the on-chip data cache, the external memory, and the processing units.

25. A system according to claim 23, wherein individual ones of the LDPC codes are needed by different processing units at different times, and once, one of the LDPC codes is stored in the data cache, said one of the LDPC codes is kept in the data cache until said one of the LDPC codes is no longer needed by any of the processing units.

* * * * *